(12) United States Patent
Petrin

(10) Patent No.: US 7,393,175 B2
(45) Date of Patent: Jul. 1, 2008

(54) ACTUATOR SYSTEM FOR NANOSCALE MOVEMENT

(75) Inventor: Andrei-B. Petrin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 394 days.

(21) Appl. No.: 10/852,501

(22) Filed: May 24, 2004

(65) Prior Publication Data

US 2005/0036878 A1   Feb. 17, 2005

(30) Foreign Application Priority Data

Jul. 23, 2003   (KR) .................. 10-2003-0050624

(51) Int. Cl.
  *B25J 11/00*   (2006.01)
(52) U.S. Cl. .................. 414/749.1; 74/490.09; 359/393
(58) Field of Classification Search .............. 414/749.1; 74/490.09, 490.1, 490.07; 977/700, 962, 977/963; 901/16; 269/56, 58; 359/393, 359/392

See application file for complete search history.

(56) References Cited

U.S. PATENT DOCUMENTS 5,638,206 A * 6/1997 Sumiya et al. .............. 359/368
6,327,929 B1 * 12/2001 Yanagisawa ............. 74/490.09

* cited by examiner

*Primary Examiner*—Donald Underwood
(74) *Attorney, Agent, or Firm*—The Farrell Law Firm, PC

(57) ABSTRACT

An actuator system for making a nanoscale movement of an object is provided. In the actuator system, a platform supports the object. A Z-axis actuator connects the platform to the object in a Z-axis direction, and moves the object in the Z-axis direction by Z-axis direction transformation. A frame supports the platform around the platform. An X-axis actuator connects the frame to the platform in an X-axis or Y-axis direction perpendicular to the Z-axis, and moves the object in the X-axis direction by transformation in the direction perpendicular to the Z-axis.

13 Claims, 15 Drawing Sheets

ACTUATOR SYSTEM FOR NANOSCALE MOVEMENT

PRIORITY

This application claims priority under 35 U.S.C. § 119 to an application entitled "Actuator System for Nanoscale Movement" filed in the Korean Intellectual Property Office on Jul. 23, 2003 and assigned Serial No. 2003-50624, the contents of which are incorporated herein by reference.

BACKGROUND OF THE INVENTION

1. Field of the Invention

The present invention relates generally to nanoscale applications, and in particular, to an actuator system for making a precise three-dimensional nanoscale movement of an object.

2. Description of the Related Art

Many nanoscale applications including a nanoscale data storage device need to move one plane near another plane three-dimensionally. This movement requires a nanoscale precision and those planes must be parallel to each other. In general, a parallel displacement relative to a plane takes a larger movement space than a perpendicular displacement. The primary consideration for the nanoscale movement is that displacement must not involve friction, that is, only the elastic transformation of a solid material (i.e. bending, or expansion and contraction) is allowed. A current known method of making a movement with a nanoscale precision relies on the use of an electromagnetic actuator.

A distinctive drawback to the conventional electromagnetic actuator is that it leads to a narrow bandwidth due to magnetic field, heat, and slow speed.

SUMMARY OF THE INVENTION

It is, therefore, an object of the present invention to provide an actuator system for making a nanoscale movement of an object faster than a conventional one.

It is another object of the present invention to provide an actuator system for widening the movement range of an object using a piezoelectric element.

The above objects are achieved by an inventive actuator system for making a nanoscale movement of an object. In the inventive actuator system, a platform supports the object. A Z-axis actuator connects the platform to the object in a Z-axis direction and moves the object in the Z-axis direction by Z-axis direction transformation. A frame supports the platform around the platform. An X-axis actuator connects the frame to the platform in an X-axis or Y-axis direction perpendicular to a Z-axis, and moves the object in the X-axis direction by transformation in the direction perpendicular to the Z-axis.

The actuators are configured to include bimorph elements or, simply, bimorph, or equivalents. A bimorph is a device manufactured with two strips of piezoelectric film which are fastened together and which have electrodes allowing electrical fields of the proper polarity to be applied to the film to cause an electrostrictive effect to occur. Such electrostrictive effect can be an in-plane elongation or contraction, or an out-of-plane deflection of one end of the film when the opposite end is secured.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
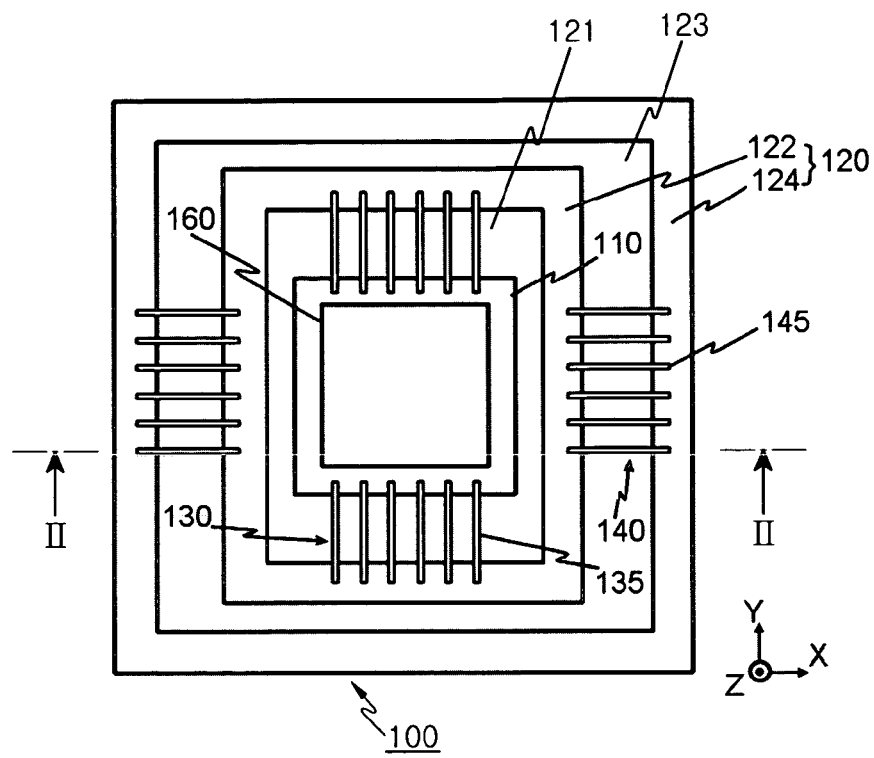
FIG. 1 is a plan view of an actuator system for making a nanoscale movement of an object according to one of the preferred embodiments of the present invention.
Figure 2:
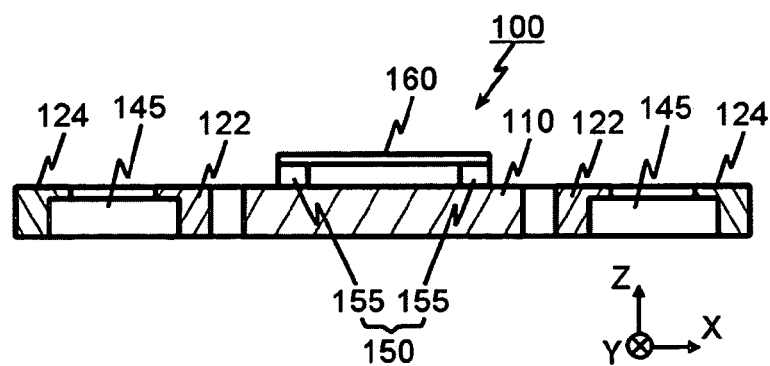
FIG. 2 is a front sectional view of the actuator system illustrated in FIG. 1.

FIG. 1 is a plan view of an actuator system for making a nanoscale movement of an object according to an embodiment of the present invention, and FIG. 2 is a front sectional view of the actuator system taken along lines II-II, as illustrated in FIG. 1. Referring to FIGS. 1 and 2, an actuator system 100 includes a platform 110, a frame 120, and X-, Y- and Z-axis actuators 130, 140 and 150.

The platform 110 is planar and supports an object 160. The object 160 can be a nanoscale data storage medium having a substrate and a polymer layer deposited on the substrate.

The frame 120, including first and second subframes 122 and 124, surrounds the platform 110. The first subframe 122 is around the platform 110 and has a square opening 121 at its center receiving the platform 110.

The X-axis actuator 130 connects the platform 110 to the first subframe 122 in a Y-axis direction. It includes a plurality of first bimorphs 135 for converting electrical energy to mechanical energy. The first bimorphs 135 are bent in an X-axis direction according to an applied current, thereby moving the platform 110 connected to their ends in the X-axis direction. The X-axis actuator 130 is fixed to the first subframe 122 at one end and to the platform 110 at the other end. Since the first subframe 122 is connected to the second subframe 124 by the Y-axis actuator 140, the first subframe 122 is fixed relatively to the platform 110 along the Y-axis direction.

The second subframe 124 is around the first subframe 122 and has a square opening 123 at its center.

The Y-axis actuator 140 connects the first subframe 122 to the second subframe 124 in the X-axis direction. It includes a plurality of second bimorphs 145 for converting electrical energy to mechanical energy. The second bimorphs 145 are bent in the Y-axis direction according to an applied current, thereby moving the first subframe 122 connected to one of the opposite ends of the bimorphs 145 in the Y-axis direction. The other ends of the Y-axis actuator 140 are fixed to the second subframe 124.

The Z-axis actuator 150 connects the object 160 to the platform 110 in a Z-axis direction. It includes a plurality of multi-layer piezoelectric elements 155 for converting electrical energy to mechanical energy. The multi-layer piezoelectric elements 155 are extended in the Z-axis direction according to an applied current, thereby moving the object 160, which is connected to one of their opposite ends in the Z-axis direction, relative to the platform 110 coupled to the other ends of the piezoelectric elements 155.

Figure 3:
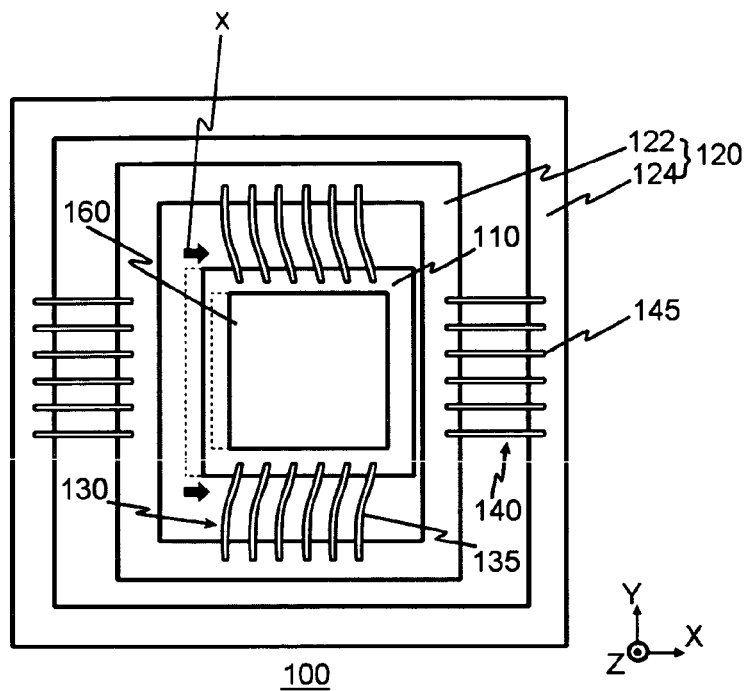
FIGS. 3 and 4 depict the operation of the actuator system illustrated in FIG. 1.
Figure 4:
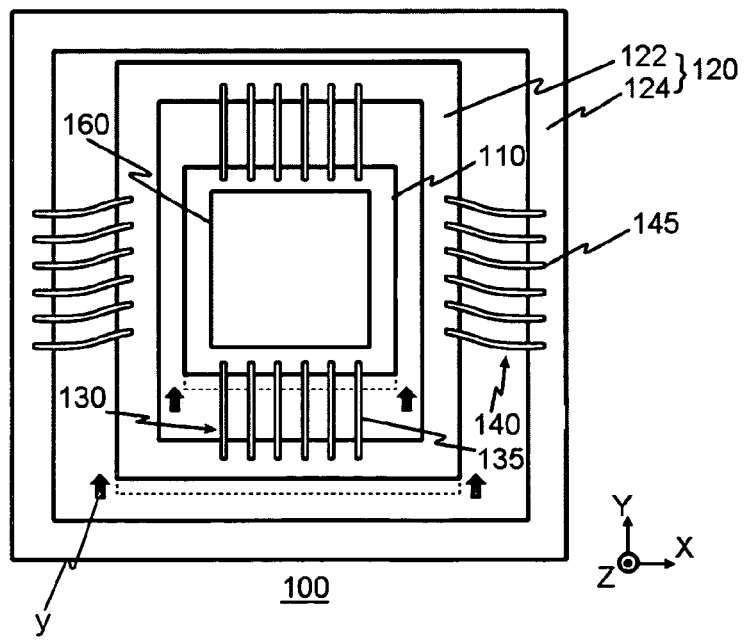

FIGS. 3 and 4 depict the operation of the actuator system illustrated in FIG. 1. Referring to FIG. 3, the X-axis actuator 130 is bent in the X-axis direction according to an applied current and thus moves the platform 110 in the X-axis direction relative to both subframes 122 and 124. Referring to FIG. 4, the Y-axis actuator 140 is bent in the Y-axis direction according to an applied current and thus moves the first subframe 122 and the platform 110 with the object 160 in the Y-axis direction relative to the second subframe 124.

Figure 5:
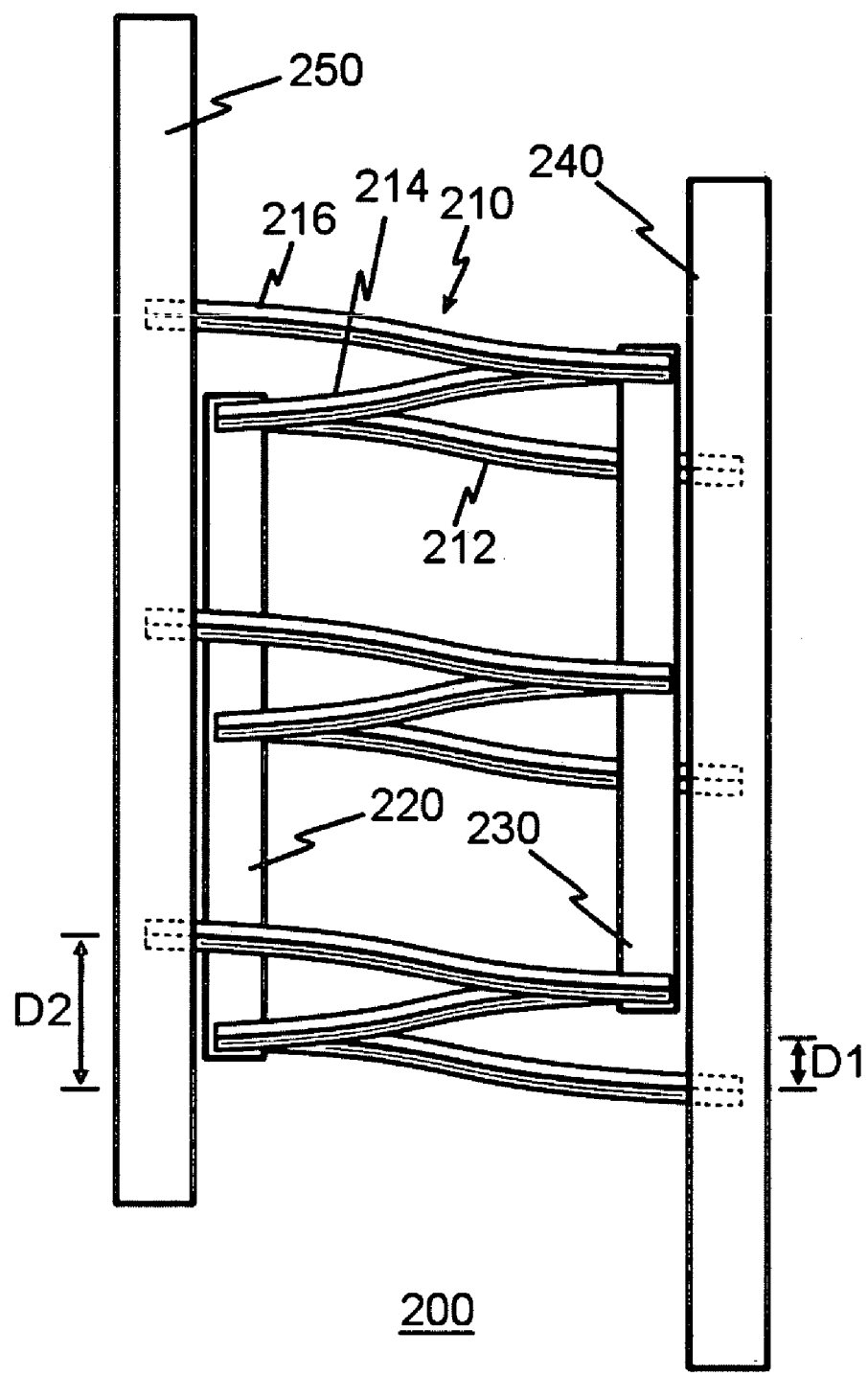
FIG. 5 illustrates an actuator using 3-fold bimorphs according to the present invention.

FIG. 5 illustrates the principle of operation of an actuator 200 using 3-fold bimorphs according to the present invention. The actuator 200 is configured to move an object 250 in parallel to a fixing wall 240 and includes a plurality of 3-fold bimorphs 210 and first and second support members 220 and 230. The object 250 and the first and second support members 220 and 230 can move with respect to the fixing wall 240. Each of the 3-fold bimorphs 210 has first, second and third bimorphs 212, 214 and 216. The first bimorph 212 connects the first support member 220 to the fixing wall 240, the second bimorph 214 connects the first support member 220 to the second support member 230, and the third bimorph 216 connects the second support member 222 to the object 250. For example, one end of the first bimorph 212 is connected to the fixing wall 240 and the other end thereof to the first support member 220. Thus, the 3-fold bimorphs 210 move the object 250 according to an applied current for a distance D2, which is three times longer than a unit transformation distance D1 created by the bending of each of the bimorphs 212, 214 and 216. Although the first, second and third bimorphs 212, 214 and 216 are transformed simultaneously, it is assumed that they are transformed sequentially for notational simplicity. As the first bimorph 212 fixed to the fixing wall 240 at one end and to the first support member 220 at the other end is bent according to an applied current, the object 250 and the first and second support members 220 and 230 movable relative to the fixing wall 240 move for one unit transformation distance D1 along the fixing wall 240. Then, as the second bimorph 214 fixed to the first support member 220 at one end and to the second support member 230 at the other end is bent according to an applied current, the object 250 and the second support member 230 movable relative to the first support member 220 move for one more unit transformation distance D1 along the fixing wall 240. Finally as the third bimorph 216 fixed to the second support member 230 at one end and to the object 250 at the other end is bent according to an applied current, the object 250 movable relative to the second support member 230 moves for one more unit transformation distance D1 along the fixing wall 240. As a result, the object 250 has moved for three-unit transformation distance D2.

Figure 6:
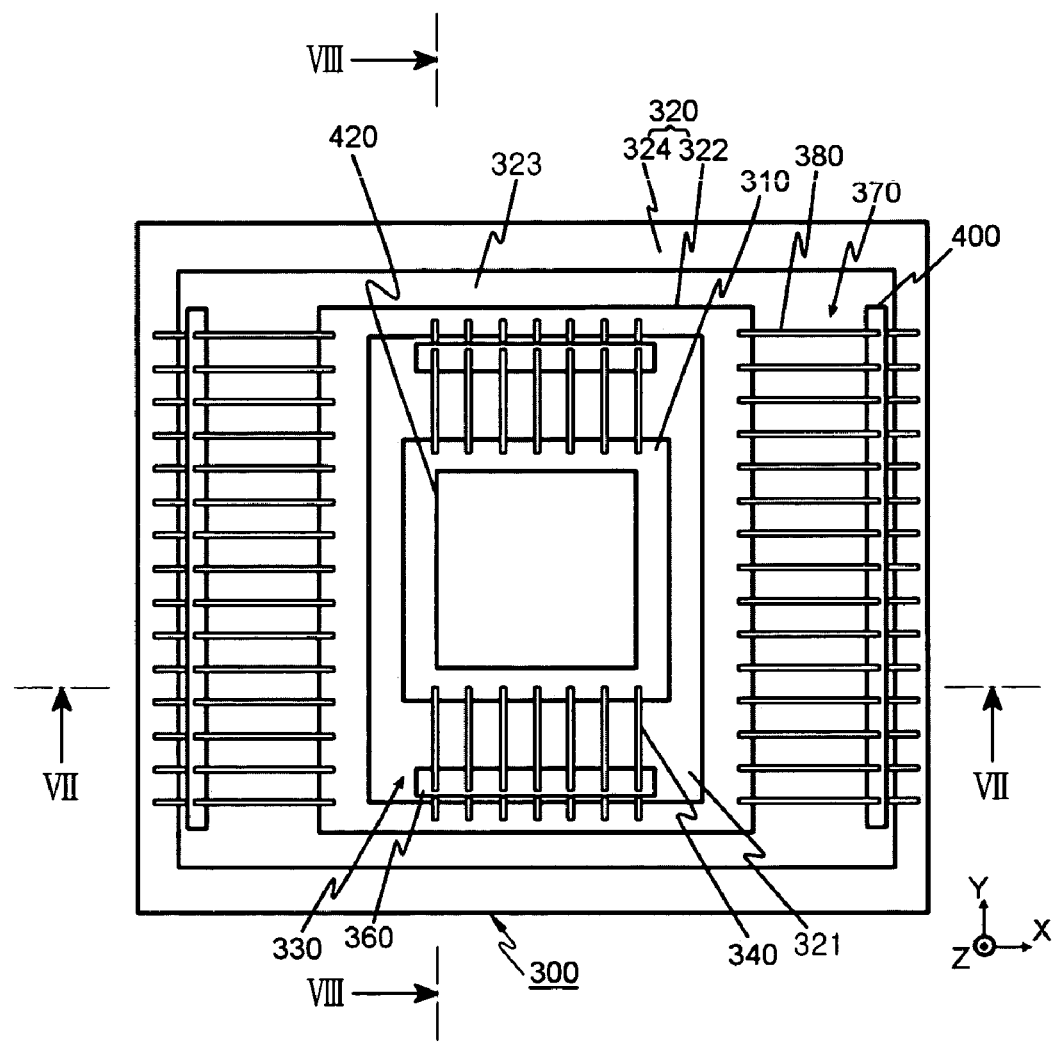
FIG. 6 is a plan view of an actuator system for making a nanoscale movement of an object according to another preferred embodiment of the present invention.
Figure 7:
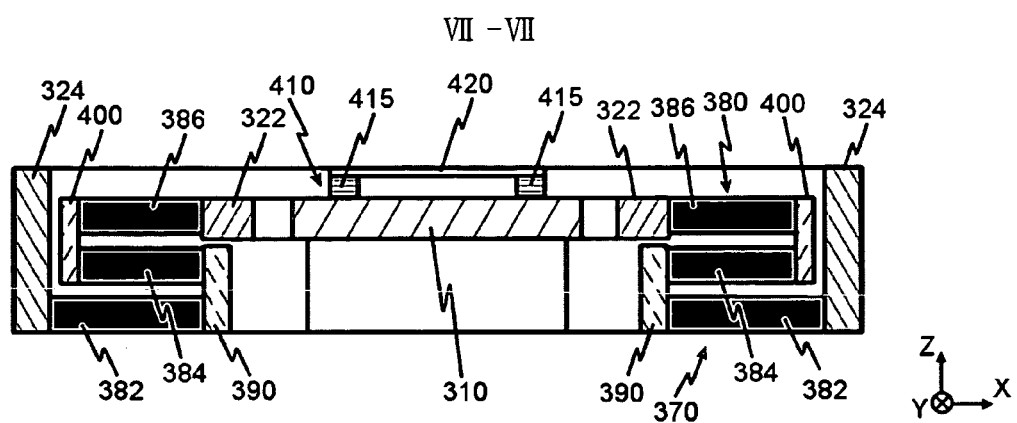
FIG. 7 is a front sectional view of the actuator system illustrated in FIG. 6.
Figure 8:
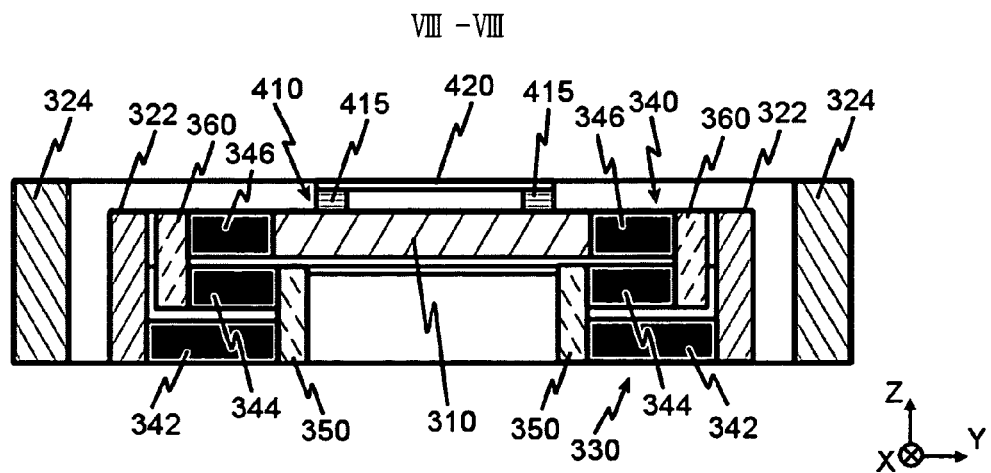
FIG. 8 is a side sectional view of the actuator system illustrated in FIG. 6.

FIG. 6 is a plan view of an actuator system for making a nanoscale movement of an object according to another embodiment of the present invention, FIG. 7 is a front sectional view of the actuator system taken along lines VII-VII, as illustrated in FIG. 6, and FIG. 8 is a side sectional view of the actuator system taken along lines VIII-VIII, as illustrated in FIG. 6.

Referring to FIGS. 6, 7 and 8, an actuator system 300 includes a platform 310, a frame 320, and X-, Y- and Z-axis actuators 330, 370 and 410.

The platform 310 is planar and supports an object 420. The object 420 can be a nanoscale data storage medium having a substrate and a polymer layer deposited on the substrate.

The frame 320, including first and second subframes 322 and 324, respectively, surrounds the platform 310. Each of the first and second subframes 322, 324 have concentric square openings 321 and 323 separating the first subframe 322 from platform 310 and from the second subframe 324, respectively, as illustrated in FIG. 6.

The X-axis actuator 330 connects the platform 310 to the first subframe 322 in a Y-axis direction. It includes a plurality of first 3-fold bimorphs 340 for converting electrical energy to mechanical energy, and first and second support members 350 and 360, as better illustrated in FIG. 8. The platform 310 and the first and second support members 350 and 360 are movable with respect to the first subframe 322 along the X-axis direction perpendicular to the plane of the drawing. Each of the first 3-fold bimorphs 340 includes first, second and third bimorphs 342, 344 and 346. The first bimorph 342 is fixed to the first subframe 322 at one end and to the first support member 350 at the other end, thereby connecting the first subframe 322 to the first support member 350. The second bimorph 344 is fixed to the first support member 350 at one end and to the second support member 360 at the other end, thereby connecting the first support member 350 to the second support member 360. The third bimorph 346 is fixed to the second support member 360 at one end and to the platform 310 at the other end, thereby connecting the second support member 360 to the platform 310. Thus, the 3-fold bimorphs 340 move the platform 310 according to an applied current for a distance three times longer than a unit transformation distance created by the bending of each of the bimorphs 342, 344 and 346. That is, the X-axis actuator 330 is bent in the X-axis direction according to an applied current, thereby moving the platform 310 in the X-axis direction.

The Y-axis actuator 370, as illustrated in FIG. 7, connects the first subframe 322 to the second subframe 324 in the X-axis direction. It includes a plurality of second 3-fold bimorphs 380 for converting electrical energy to mechanical energy, and third and fourth support members 390 and 400. Each of the second 3-fold bimorphs 380 includes fourth, fifth and sixth bimorphs 382, 384 and 386. The fourth bimorph 382 connects the second subframe 324 to the third support member 390. The fifth bimorph 384 connects the third support member 390 to the fourth support member 400. The sixth bimorph 386 connects the fourth support member 400 to the first subframe 322. The Y-axis actuator 370 is bent in the Y-axis direction according to an applied current, thereby moving the first subframe 322 and the platform 310 in the Y-axis direction relative to the second subframe 324.

The Z-axis actuator 410 connects the object 420 to the platform 310 in a Z-axis direction. It includes a plurality of multi-layer piezoelectric elements 415 for converting electrical energy to mechanical energy. The multi-layer piezoelectric elements 415 are extended in the Z-axis direction according to an applied current, thereby moving the object 420 in the Z-axis direction relative to the platform 310.

Figure 9:
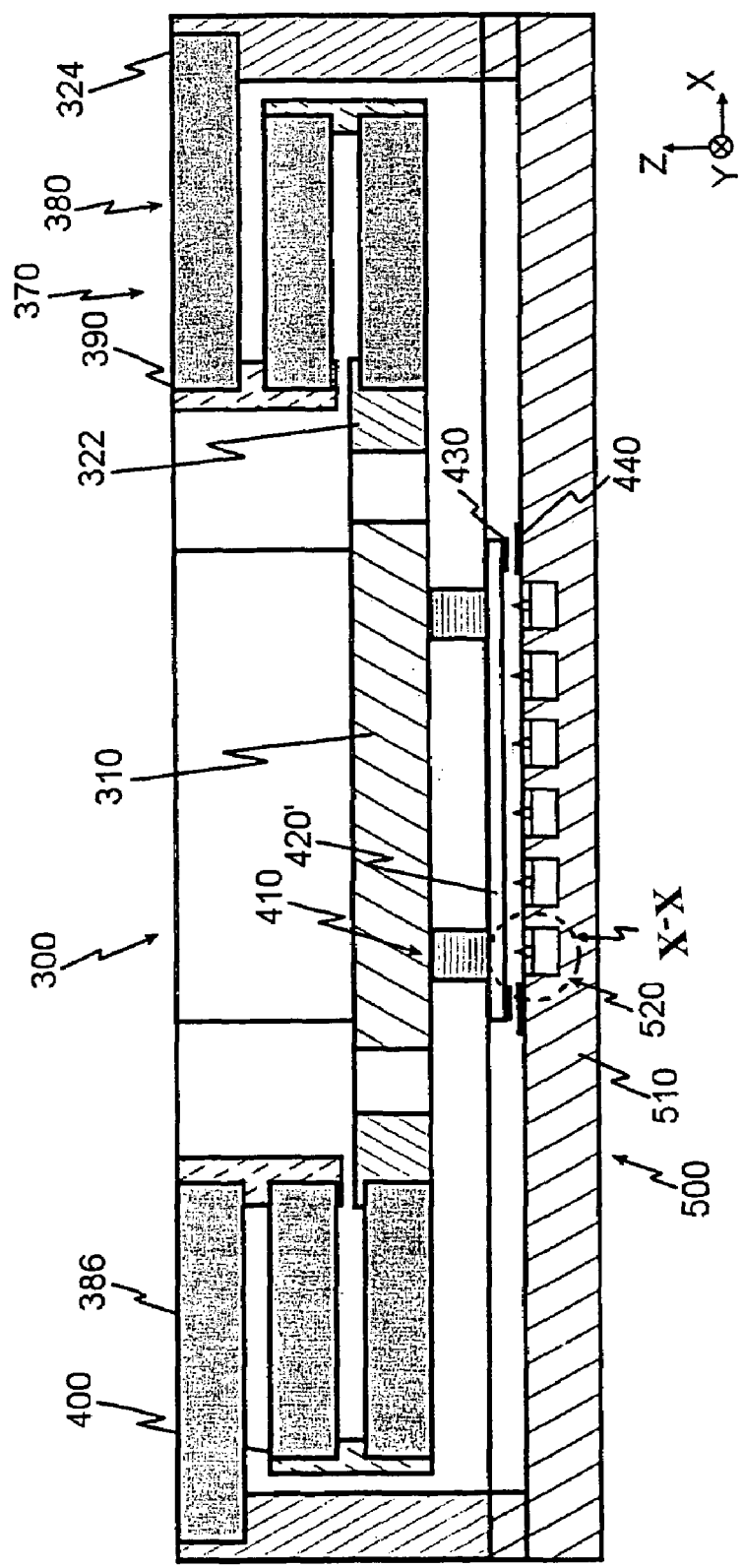
FIG. 9 illustrates an exemplary application of the actuator system illustrated in FIG. 6.
Figure 10:
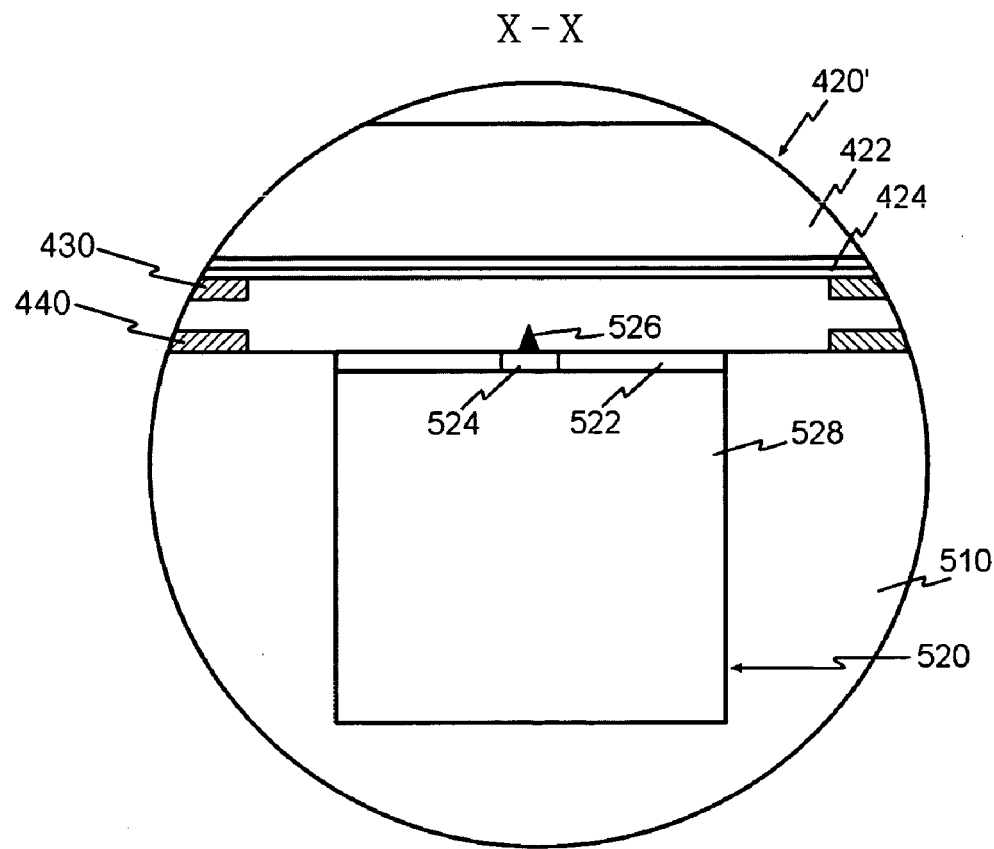
FIG. 10 is an enlarged view of a cantilever cell illustrated in FIG. 9.

FIG. 9 is an exemplary application of the actuator system illustrated in FIG. 6, and FIG. 10 is a cross-sectional view of a cantilever cell taken along lines X-X illustrated in FIG. 9. Referring to FIGS. 9 and 10, the actuator system application includes a storage medium 420' supported by the actuator system 300 and including a substrate 422 and a polymer layer 424 deposited on the substrate 422, a cantilever chip 500, and first and second capacitive sensors 430 and 440 for maintaining the storage medium 420' and the cantilever chip 500 in parallel.

The cantilever chip 500 is comprised of a plurality of cantilever cells 520 arranged in a matrix on a substrate 510. Each cantilever cell 520 writes or reads one-bit digital data on or from the storage medium 420'. The cantilever cell 520 has a cantilever 522, a heater platform 524 on an end portion of the cantilever 522, a tip 526 on the heater platform 524, and an empty space 528 under the cantilever 522. The tip 526 extending from the heater platform 524 to contact the storage medium 420 for digital data write/read.

The first capacitive sensors 430 each are attached to a respective one of the four corners of the square storage medium 420', and the second capacitive sensors 440 each are attached to the cantilever chip 500 in correspondence with a respective one of the first capacitive sensors 430. Misalignment between the juxtaposed first 430 and second 440 capacitive sensors in any of the XYZ directions generates a feedback signal outputted by either of these sensors and corresponding to the case where the storage medium 420' is not parallel to or misaligned relative to the cantilever chip 500. That is, the capacitances of the first and second capacitive sensors 430 and 440 are inversely proportional to the gap between them. The parallel degree between the storage medium 420' and the cantilever chip 500 is sensed from capacitance sensed in the four first capacitive sensors 430. For example, if the storage medium 420' and the cantilever chip 500 are parallel to each other, the capacitances sensed by the first capacitive sensors 430 are the same. If, however, the gap between one pair of the first and second capacitive sensors 430 and 440 differs from the rest of the pairs, the Z-axis actuator 415 will be energized to reestablish the parallel relationship between the cantilever chip 500 and the storage medium 420'. Concomitantly, if any misalignment is detected in the X- and/or Y-axis direction, respective actuators providing the desirable displacement of the platform 410 with the storage medium 420' will be utilized to reestablish the desired position between the medium 420' and the cantilever chip 500.

The storage medium 420 has a storage capacity of 1 Gbyte and the overall application volume does not exceed 10 mm×10 mm×3 mm.

Figure 11:
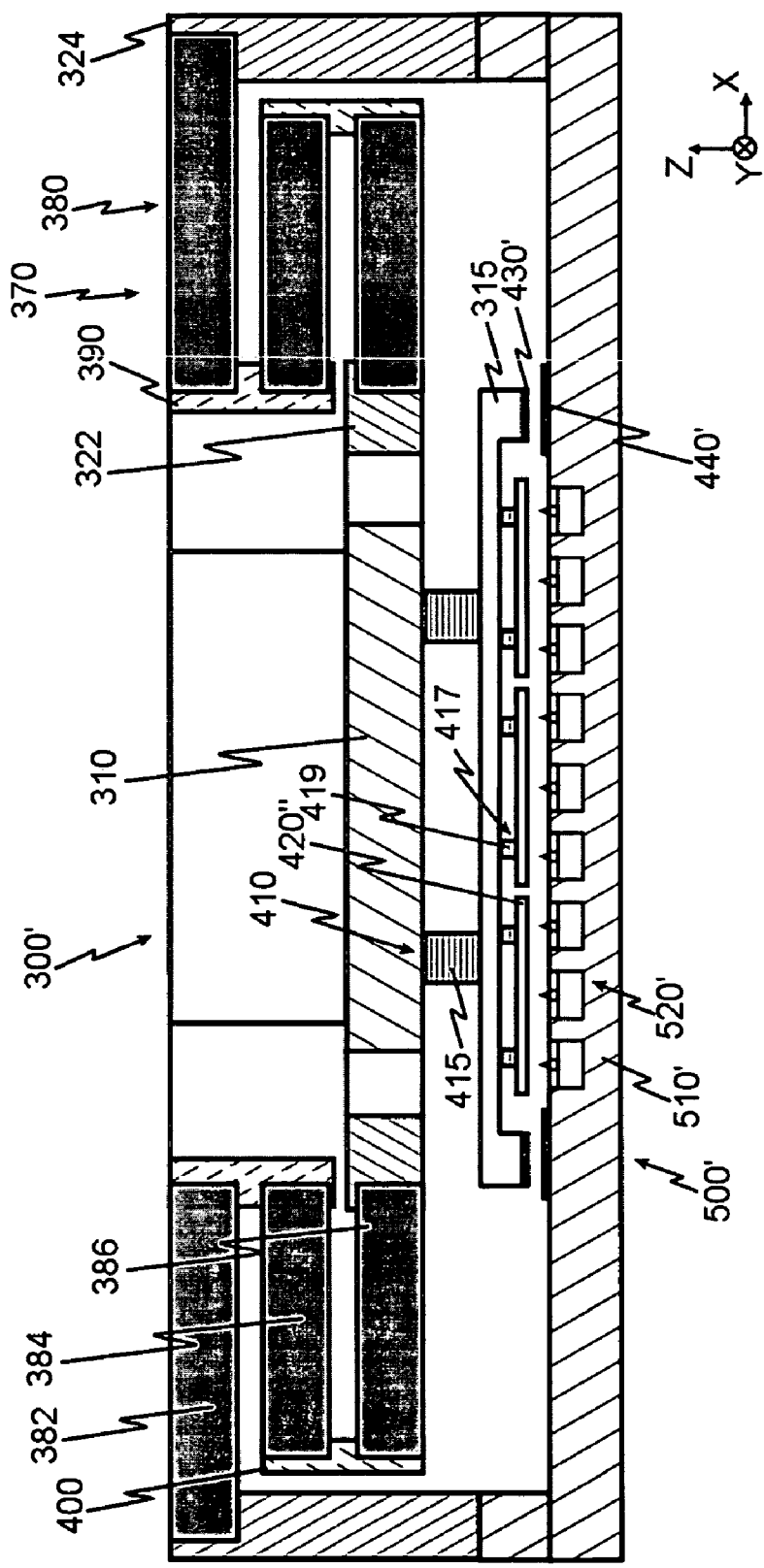
FIG. 11 illustrates a modification of the actuator system illustrated in FIG. 6 and an exemplary application of the modified actuator system according to a third preferred embodiment of the present invention.

FIG. 11 illustrates a modification of the actuator system illustrated in FIG. 6 and its exemplary application according to a third embodiment of the present invention. Like reference numerals denote the same components illustrated in FIG. 6, and thus their description is not provided here. Referring to FIG. 11, the actuator system application includes a plurality of storage mediums 420" supported by an actuator system 300', a cantilever chip 500' for writing data on the storage mediums 420", and first and second capacitive sensors 430' and 440' for maintaining the storage mediums 420" in parallel with the cantilever chip 500". The actuator system 300' includes an auxiliary platform 315 and a plurality of auxiliary actuators 417 in addition the components illustrated in FIG. 6.

The auxiliary platform 315 is in the form of a box opened at the bottom and supports the storage mediums 420". The auxiliary platform 315 is connected to a main platform 310 (i.e. the platform 310 in FIG. 6) by the Z-axis actuator 415.

The Z-axis actuator 410 connects the main platform 310 to the auxiliary platform 315 in the Z-axis direction and includes the plurality of first multi-layer piezoelectric elements 415 for converting electrical energy to mechanical energy. The first multi-level piezoelectric elements 415 each are extended in the Z-axis direction according to an applied current. Therefore, the auxiliary platform 315 moves in the Z-axis direction.

Each of the auxiliary actuators 417 connects a corresponding storage medium 420" to the main platform 310 in the Z-axis direction and includes a plurality of second multi-layer piezoelectric elements 419 for converting electrical energy to mechanical energy. The second multi-layer piezoelectric elements 419 each are extended in the Z-axis direction according to an applied current, thereby moving the respective corresponding storage mediums 420" in the Z-axis direction.

The cantilever chip 500' includes a plurality of cantilever cells 520' arranged in a matrix. Each of the cantilever cells 520' writes or reads one-bit digital data on or from its corresponding storage medium 420".

First capacitive sensors 430' are attached to the four corners of the auxiliary platform 315, and second capacitive sensors 440' are attached onto the cantilever chip 500' in correspondence with the first capacitive sensors 430'. The first capacitive sensors 430' output a feedback signal in the case where the auxiliary platform 315 is not parallel to the cantilever chip 500'.

Figure 12:
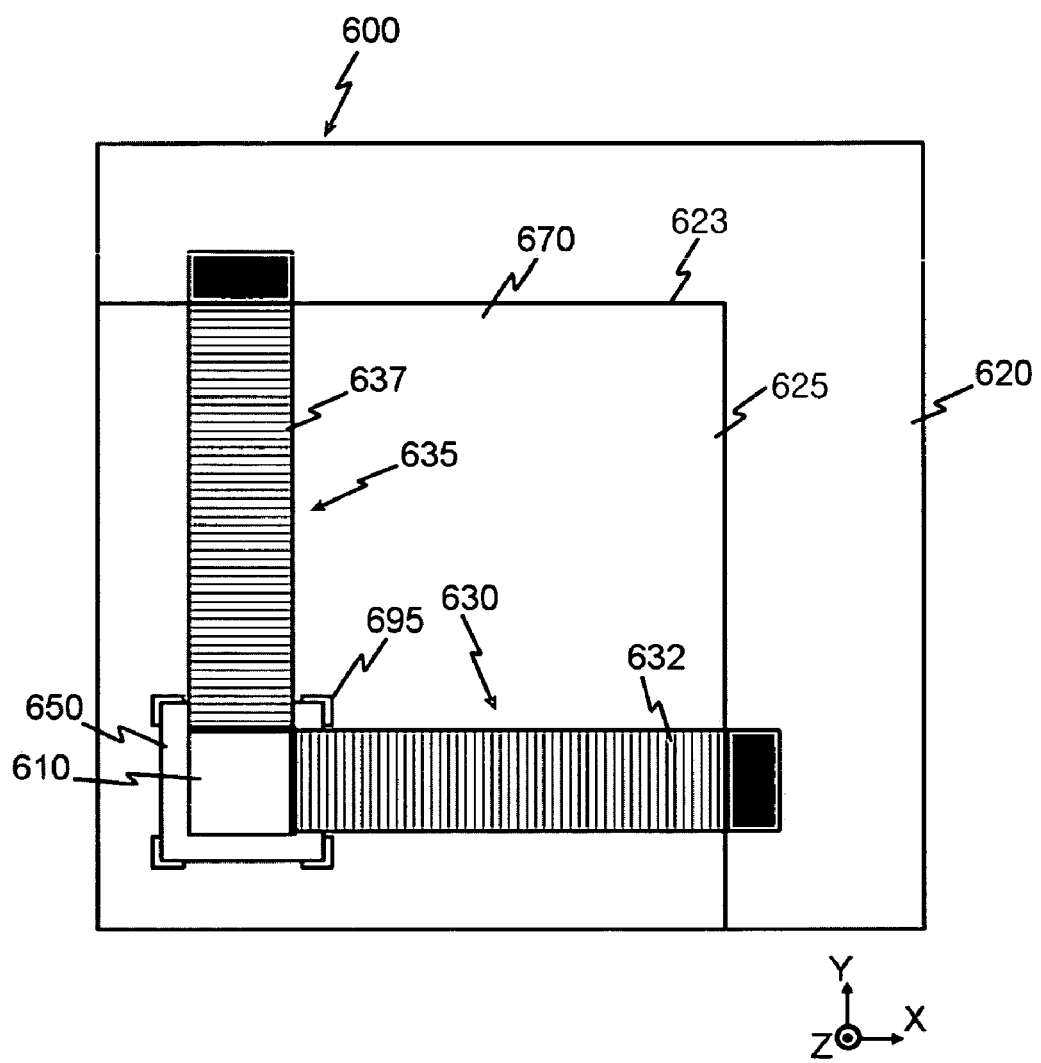
FIG. 12 is a plan view of an actuator system for making a nanoscale movement of an object and its exemplary application according to a fourth preferred embodiment of the present invention.
Figure 13:
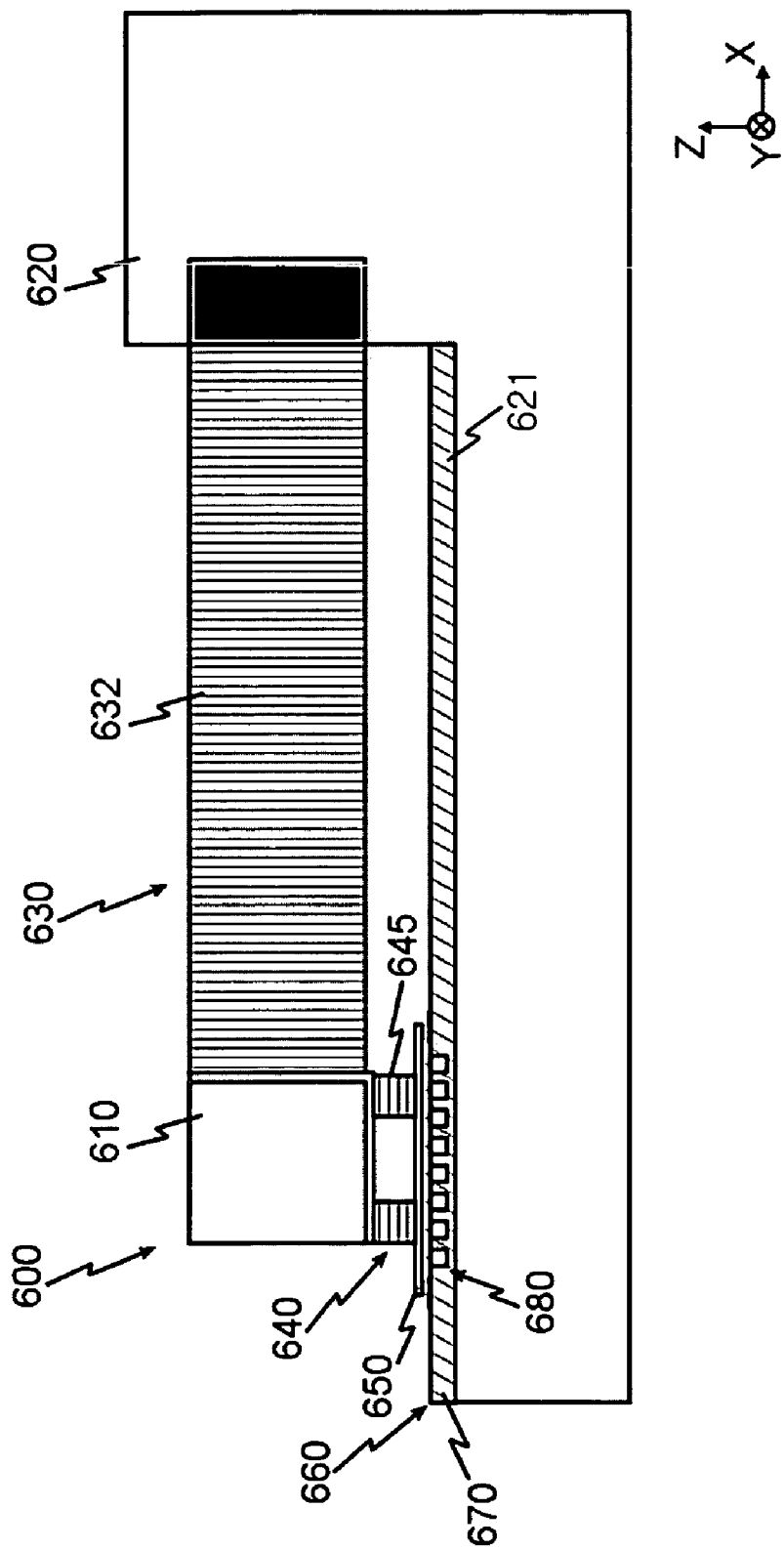
FIG. 13 is an elevational sectional side view of the structure illustrated in FIG. 12.
Figure 14:
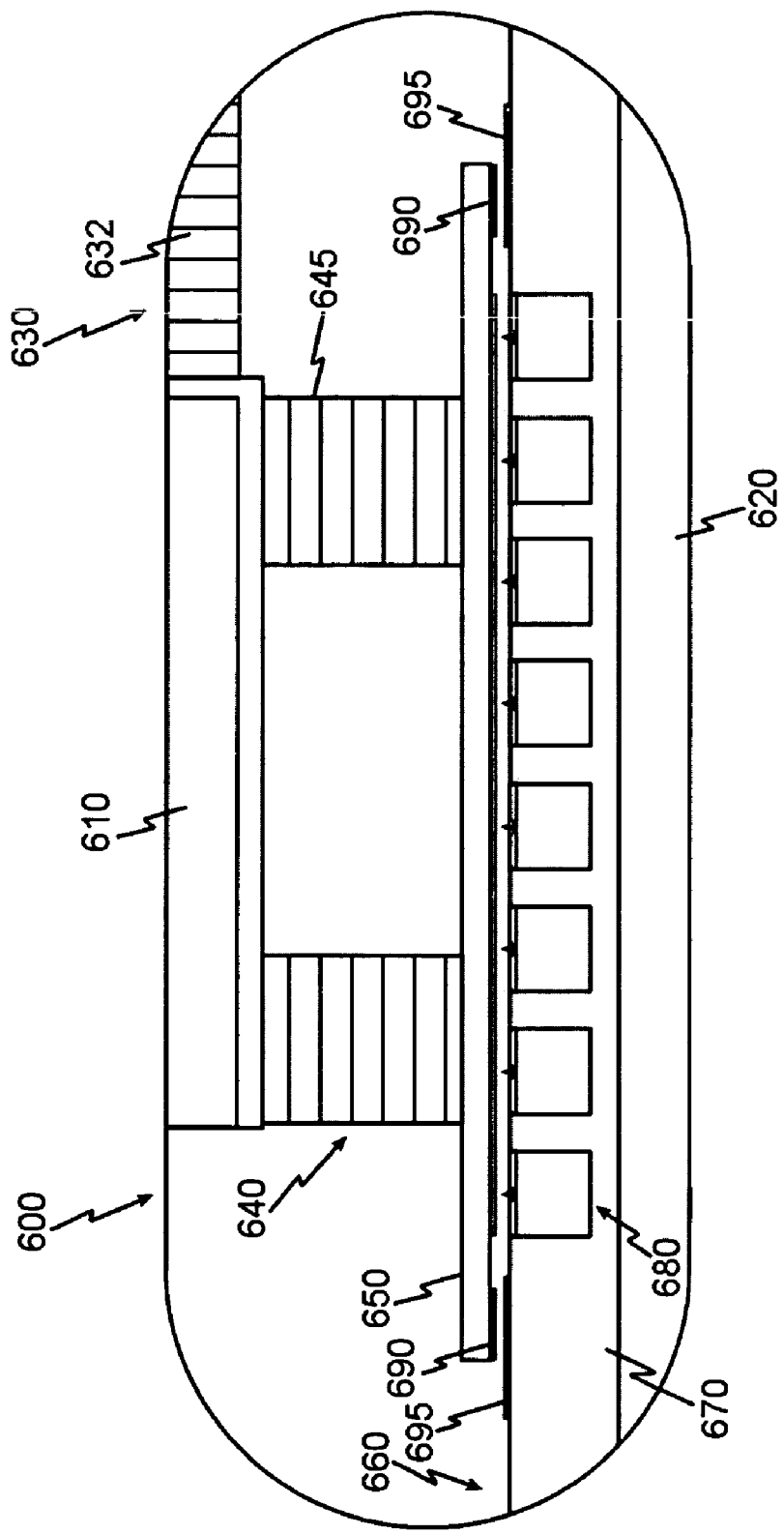
FIG. 14 is a partial enlarged view of the structure illustrated in FIG. 13.

FIG. 12 is a plan view of an actuator system for making a nanoscale movement of an object and its exemplary application according to a fourth preferred embodiment of the present invention, FIG. 13 is a side view of the structure illustrated in FIG. 12, and FIG. 14 is a partial enlarged view of the structure illustrated in FIG. 13. Referring to FIGS. 12, 13 and 14, the actuator system application includes a storage medium 650 supported by an actuator system 600, a cantilever chip 660 for writing data on the storage medium 650, and first and second capacitive sensors 690 and 695 for maintaining the storage medium 650 and the cantilever chip 660 in parallel. The actuator system 600 includes a platform 610, a frame 620, and X-, Y- and Z-axis actuators 630, 635 and 640.

The platform 610 is in the form of a square block and supports the storage medium 650. Similarly to the previously disclosed platforms 110, 310 and 410, the square shape of the platform 610 is preferable, but not necessary, and may have a different polygonal shape as well as a circular shape.

The cantilever chip 660 is comprised of a plurality of cantilever cells 680 arranged in a matrix on a substrate 670. Each cantilever cell 680 writes or reads one-bit digital data on or from the storage medium 650.

The frame 620 surrounds the platform 610. It has a planar base portion 621 supporting the substrate 670 (FIG. 13) and a sidewall extending upward from the two adjacent sides 623 and 625 of the base portion (see FIG. 12). The cantilever chip 660 is mounted on the base portion and ends of the X- and Y-axis actuators 630 and 635 are fixed to the sidewalls 625 and 623 of the frame 620.

The X-axis actuator 630 connects the platform 610 to the sidewall of the frame 620 in an X-axis direction. It includes a plurality of first multi-layer piezoelectric elements 632 for converting electrical energy to mechanical energy. The first multi-layer piezoelectric elements 632 are extended in the X-axis direction according to an applied current, thereby moving the platform 610 in the X-axis direction.

The Y-axis actuator 635 connects the platform 610 to the sidewall of the frame 620. It includes a plurality of second multi-layer piezoelectric elements 637 for converting electrical energy to mechanical energy. The second multi-layer piezoelectric elements 637 are extended in the Y-axis direction according to an applied current, thereby moving the platform 610 in the Y-axis direction.

The Z-axis actuator 640 connects the platform 610 to the storage medium 650 in the Z-axis direction. It includes a plurality of third multi-layer piezoelectric elements 645 for converting electrical energy to mechanical energy. The third multi-layer piezoelectric elements 645 are extended in the Z-axis direction according to an applied current, thereby moving the storage medium 650 in the Z-axis direction.

The first capacitive sensors 690 are attached to the four corners of the storage medium 650, and the second capacitive sensors 695 are attached to the cantilever chip 660 in correspondence with the first capacitive sensors 690. The first capacitive sensors 690 output a feedback signal in the case where the storage medium 650 is not parallel to the cantilever chip 660.

Figure 15:
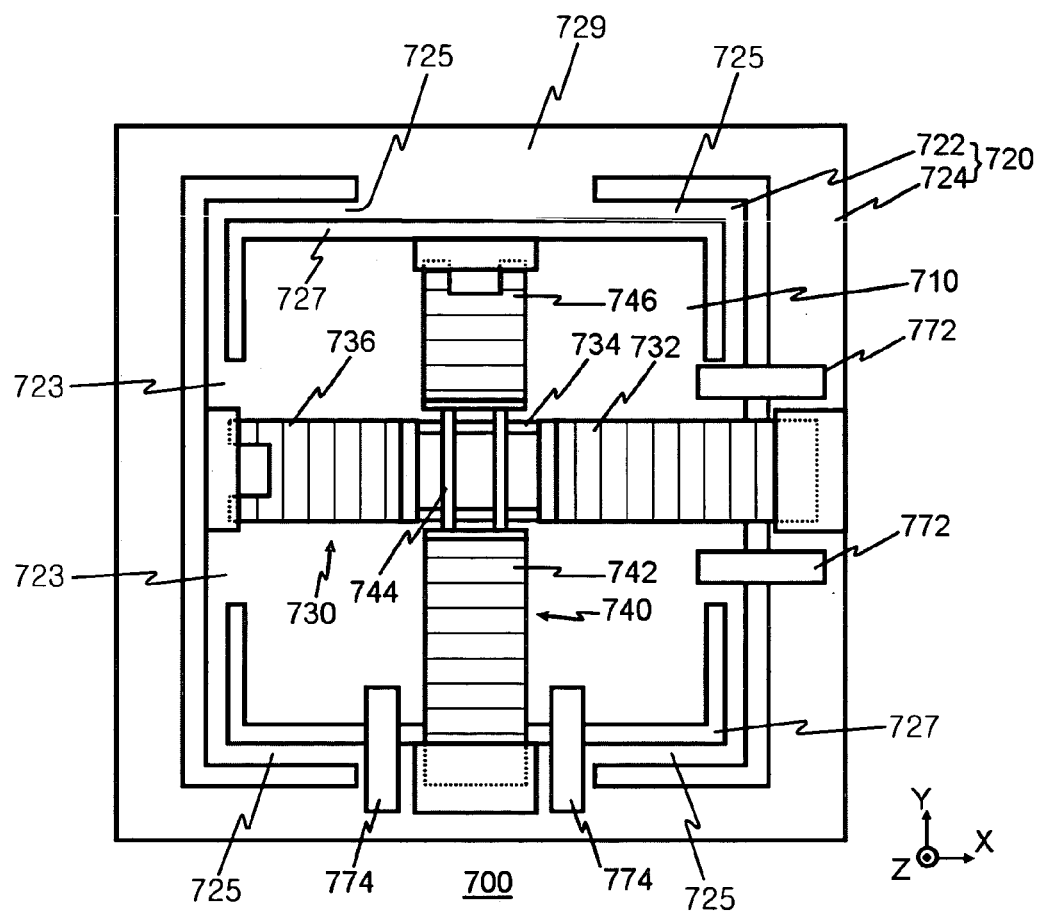
FIG. 15 is a plan view of an actuator system for making a nanoscale movement of an object according to a fifth preferred embodiment of the present invention.
Figure 16:
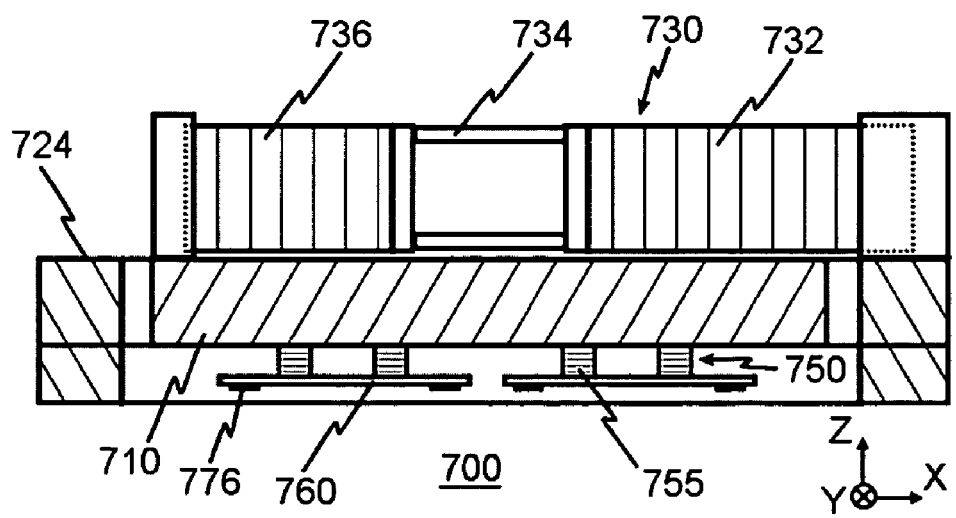
FIG. 16 is a side sectional view of the actuator system illustrated in FIG. 15.
Figure 17:
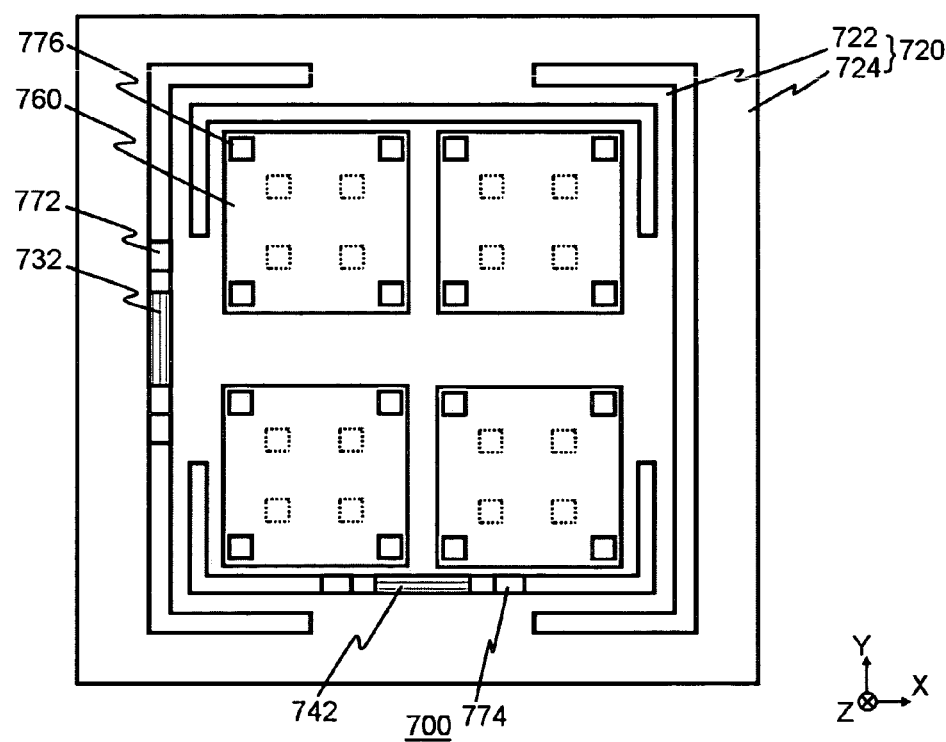
FIG. 17 is a bottom view of the actuator system illustrated in FIG. 16.

FIG. 15 is a plan view of an actuator system for making a nanoscale movement of an object according to a fifth preferred embodiment of the present invention, FIG. 16 is a side sectional view of the actuator system illustrated in FIG. 15, and FIG. 17 is a bottom view of the actuator system illustrated in FIG. 16.

Referring to FIGS. 15, 16 and 17, an actuator system 700 includes a platform 710, a frame 720, X-, Y- and Z-axis actuators 730, 740 and 750, and first, second and third capacitive sensors 772, 774 and 776. The platform 710 is integrally connected to the frame 720.

The platform 710 is planar and supports a plurality of objects 760. Each of the objects 760 can be a nanoscale data storage medium having a substrate and a polymer layer deposited on the substrate.

The frame 720, including first and second subframes 722 and 724, surrounds the platform 710. The first subframe 722 is around the platform 710 and has regions 723 (FIG. 15) integrally connected to the platform 710 in the X-axis direction and regions 725 separated from the platform 710 by recesses 727 allowing elastic displacement of the platform 710 relative to the first subframe 722 in the Y-axis direction.

The second subframe 724 is around the first subframe 722 and integrally connected thereto in the Y-axis direction along regions 729 so that the first subframe 722 along with the platform 710 are elastic or displaceable in the X-axis direction relative to the second subframe 724.

The X-axis actuator 730, as shown in FIG. 15, connects the first subframe 722 to the second subframe 724 in the X-axis direction. It includes first multi-layer piezoelectric elements 732 and 736 for converting electrical energy to mechanical energy. The first multi-layer piezoelectric elements 732 and 736 are connected by first beams 734 and extended in the X-axis direction according to an applied current, thereby moving the first subframe 722 in the X-axis direction and thus moving the objects 760 in the X-axis direction relative to the second subframe 724.

The Y-axis actuator 740 connects the platform 710 to the first subframe 722 in the Y-axis direction. It includes second multi-layer piezoelectric elements 742 and 746 for converting electrical energy to mechanical energy. The second multi-layer piezoelectric elements 742 and 746 are connected by second beams 744 and extended in the Y-axis direction according to an applied current, thereby moving the platform 710 in the Y-axis direction and thus moving the objects 760 in the Y-axis direction relative to the first subframe 722.

The Z-axis actuator 750, as illustrated in FIG. 16, connects each of the objects 760 to the platform 710 in the Z-axis direction. It includes a plurality of multi-layer piezoelectric elements 755. The multi-layer piezoelectric elements 755 each are extended in the Z-axis direction according to an applied current, thereby moving the respective corresponding objects 760 in the Z-axis direction.

A pair of first capacitive sensors 772 are positioned at both sides of the X-axis actuator 730. Specifically, oblong grooves (not shown) are formed across the first and second subframes 722 and 724 and the first capacitive sensors 772 are mounted in the grooves. Ends of the first capacitive sensors 772 are fixed to the second subframe 724, and the other ends thereof are not fixed. Hence, as the first subframe 722 is transformed in the X-axis direction, the dielectric constant between the first capacitive sensors 772 is changed. That is, as the volume of the first subframe 722 between the first capacitive sensors 772 is changed, the dielectric constant is also changed. The capacitances of the first capacitive sensors 772 are proportional to the dielectric constant, and how far the first subframe 722 has moved is estimated from the capacitances sensed by the first capacitive sensors 772.

A pair of second capacitive sensors 774 are positioned at both sides of the Y-axis actuator 740. Specifically, oblong grooves (not shown) are formed across the first subframe 722 and the platform 710 and the second capacitive sensors 774 are mounted in the grooves. Ends of the second capacitive sensors 774 are fixed to the first subframe 722, and the other ends thereof are not fixed. Hence, as the platform 710 is transformed in the Y-axis direction, the dielectric constant between the second capacitive sensors 774 is changed. That is, as the volume of the platform 710 between the second capacitive sensors 774 is changed, the dielectric constant is also changed. The capacitances of the second capacitive sensors 774 are proportional to the dielectric constant, and how far the platform 710 has moved is estimated from the capacitances sensed by the second capacitive sensors 774.

The third capacitive sensors 776 are attached to the four corners of each of the objects 760. Fourth capacitive sensors (not shown) are attached on fixtures (not shown) aligned with the objects 760 in a one to one correspondence with the third capacitive sensors 776. The third capacitive sensors 776 output a feedback signal in the case where the objects 760 are not in parallel with the fixtures.

Figure 18:
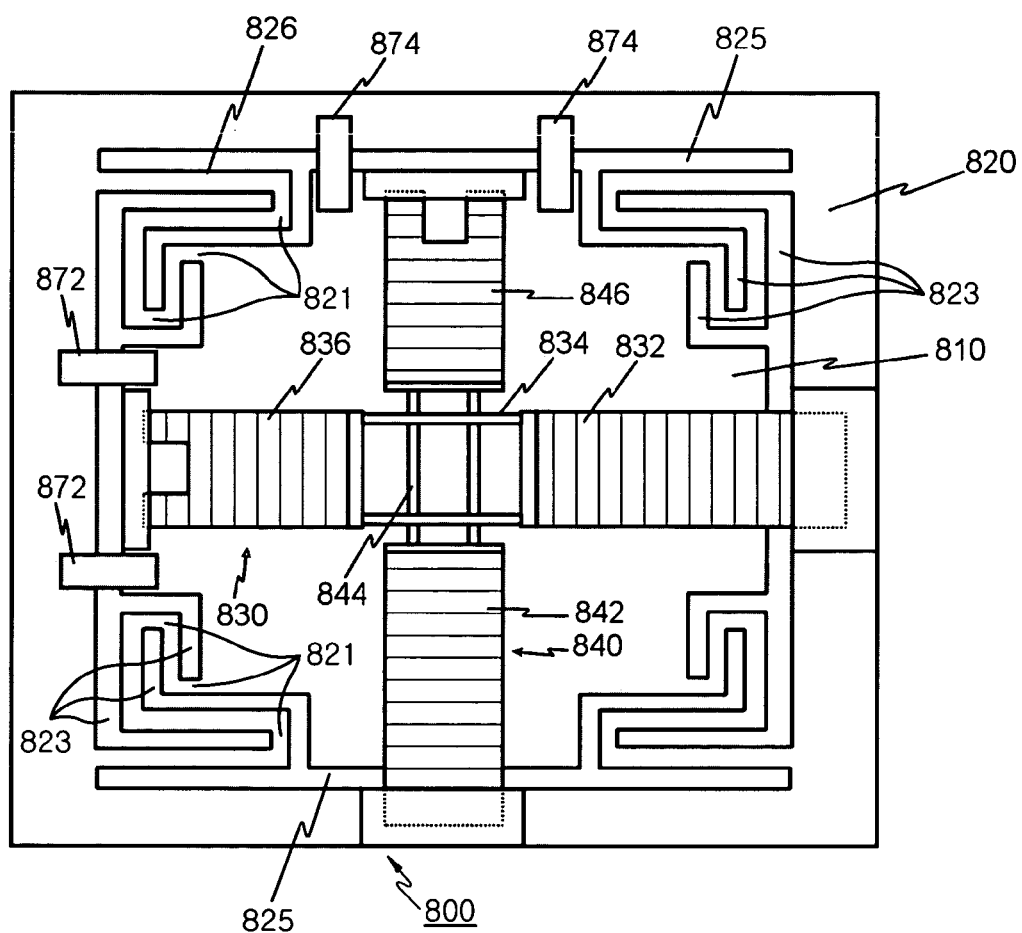
FIG. 18 is a plan view of an actuator system for making a nanoscale movement of an object according to a sixth preferred embodiment of the present invention.

FIG. 18 is a plan view of an actuator system for making a nanoscale movement of an object according to a sixth preferred embodiment of the present invention. Since the actuator system is similar in configuration to that illustrated in FIG. 15, a description of the same components is not provided here. Referring to FIG. 18, an actuator system 800 includes a platform 810, a frame 820, X- and Y-axis actuators 830 and 840, respectively, and first and second capacitive sensors 872 and 874. The platform 810 and the frame 820 have in common corner regions 821 integrally connecting these two.

The platform 810 is planar and supports objects (not shown). Each of the objects can be a nanoscale data storage medium having a substrate and a polymer layer deposited on the substrate.

The frame 820 surrounds the platform 810. The frame 820 is connected to the platform 810 by four labyrinth-shaped connectors 826 provided at each of the four corner regions 821 and defined by recesses 823 and 825. The recesses 823 allow relative displacement between the platform 810 and the frame 820 in the X-axis direction, and the recesses 825 provide elasticity in the Y-axis direction.

The X-axis actuator 830 connects the platform 810 to the frame 820 in the X-axis direction. It includes first multi-layer piezoelectric elements 832 and 836 for converting electrical energy to mechanical energy. The first multi-layer piezoelectric elements 832 and 836 are connected by first beams 834 and extended in the X-axis direction according to an applied current, thereby moving the platform 810 in the X-axis direction.

The Y-axis actuator 840 connects edges of the platform 810 to the frame 820 in the Y-axis direction. It includes second multi-layer piezoelectric elements 842 and 846 for converting electrical energy to mechanical energy. The second multi-layer piezoelectric elements 842 and 846 are connected by second beams 844 and extended in the Y-axis direction according to an applied current, thereby moving the platform 810 in the Y-axis direction.

As described above, the present invention advantageously provides an actuator system that can move an object faster than a conventional one by use of actuators using various piezoelectric elements and frame structures connected directly or indirectly to the actuators. Furthermore, the use of actuators using 3-fold bimorphs widens the limited movement range of a single piezoelectric element.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An actuator system for making a nanoscale movement of an object, comprising:
    a platform for supporting the object;
    a Z-axis actuator connecting the platform to the object in a Z-axis direction, for moving the object in the Z-axis direction by Z-axis direction transformation;
    a frame around the platform, for supporting the platform; and
    an X-axis actuator connecting the frame to the platform in a Y-axis direction perpendicular to a Z axis, for moving the object in the X-axis direction by transformation in the X-axis direction perpendicular to the Z axis.

2. The actuator system of claim 1, further comprising a Y-axis actuator connecting the frame to the platform in the X-axis direction perpendicular to the Z axis, for moving the object in the Y-axis direction by transformation in the Y-axis direction perpendicular to the Z axis.

3. An actuator system for making a nanoscale movement of an object, comprising:
    a main platform for supporting the object;
    a Z-axis actuator connecting the main platform to the object in a Z-axis direction, for moving the object in the Z-axis direction by Z-axis direction transformation;
    a first subframe around the main platform, for supporting the main platform;
    an X-axis actuator connecting the first subframe to the main platform in a Y-axis direction perpendicular to a Z axis, for moving the object in an X-axis direction by transformation in the X-axis direction perpendicular to the Y and Z axes;
    a second subframe around the first subframe, for supporting the first subframe; and
    a Y-axis actuator connecting the first subframe to the second subframe in the X-axis direction, for moving the object in the Y-axis direction by Y-axis direction transformation.

4. The actuator system of claim 3, wherein the X-axis actuator includes a plurality of 3-fold bimorphs and first and second support members positioned movably with respect to the first subframe, and each of the 3-fold bimorphs includes first, second, and third bimorphs, the first bimorph connecting the first subframe to the first support member, the second bimorph connecting the first support member to the second support member, and the third bimorph connecting the second support member to the main platform.

5. The actuator system of claim 3, wherein the Y-axis actuator includes a plurality of 3-fold bimorphs and first and second support members positioned movably with respect to the first subframe, and each of the 3-fold bimorphs includes first, second, and third bimorphs, the first bimorph connecting the second subframe to the first support member, the second bimorph connecting the first support member to the second support member, and the third bimorph connecting the second support member to the first subframe.

6. The actuator system of claim 3, further comprising an auxiliary platform in the form of a box opened at the bottom and an auxiliary actuator, the auxiliary platform being connected to the platform by the Z-axis actuator, and the auxiliary actuator connecting the object to the auxiliary platform in the Z-axis direction, for moving the object in the Z-axis direction by Z-axis direction transformation.

7. An actuator system for making a nanoscale movement of an object, comprising:
    a platform for supporting the object;
    a Z-axis actuator connecting the platform to the object in a Z-axis direction and configured to displace the object in the Z-axis direction by Z-axis direction transformation;
    a frame extending partially around the platform and configured to support the platform;
    an X-axis actuator connecting the frame to the platform in an X-axis direction perpendicular to a Z axis and operative to displace the object in the X-axis direction by X-axis direction transformation; and
    a Y-axis actuator connecting the frame to the platform in a Y-axis direction perpendicular to the X and Z axes and operative to displace the object in the Y-axis direction by Y-axis direction transformation, wherein the X-axis actuator includes a plurality of first multi-layer piezoelectric elements extending in the X-axis direction according to an applied current and the Y-axis actuator includes a plurality of second multi-layer piezoelectric elements extending in the Y-axis direction according to an applied current.

8. An actuator system for making a nanoscale movement of an object, comprising:
    a platform for supporting the object;
    a Z-axis actuator connecting the platform to the object in a Z-axis direction, for moving the object in the Z-axis direction by Z-axis direction extension;
    a first subframe integrally connected to a portion of the platform in an X-axis direction perpendicular to Z and Y axes around the platform, for making the platform elastic in a Y-axis direction perpendicular to the Z axis;
    a second subframe integrally connected to a portion of the first subframe in the Y-axis direction around the first subframe, for making the first subframe elastic in the X-axis direction;

an X-axis actuator connecting the first subframe to the second subframe in the X-axis direction, for moving the object in the X-axis direction by X-axis direction transformation; and a Y-axis actuator connecting the first subframe to the platform in the X-axis direction, for moving the object in the Y-axis direction by Y-axis direction transformation.

9. An actuator system for making a nanoscale movement of an object, comprising:

a platform for supporting the object;

a Z-axis actuator connecting the platform to the object in a Z-axis direction, for moving the object in the Z-axis direction by Z-axis direction transformation;

a frame integrally connected to portions of the platform in two diagonal directions around the platform, for making the platform elastic in mutually perpendicular X-axis and Y-axis directions perpendicular to a Z axis;

an X-axis actuator connecting the frame to the platform in the X-axis direction, for moving the object in the X-axis direction by X-axis direction transformation; and a Y-axis actuator connecting the frame to the platform in the Y-axis direction, for moving the object in the Y-axis direction by Y-axis direction transformation.

10. The actuator system of claim 1, wherein the X-axis actuator includes a plurality of 3-fold bimorphs and first and second support members positioned movably with respect to the frame, and each of the 3-fold bimorphs including first, second, and third bimorphs, the first bimorph connecting the frame to the first support member, the second bimorph connecting the first support member to the second support member, and the third bimorph connecting the second support member to the platform.

11. The actuator system of claim 2, wherein the Y-axis actuator includes a plurality of 3-fold bimorphs and first and second support members positioned movably with respect to the frame, and each of the 3-fold bimorphs including first, second, and third bimorphs, the first bimorph connecting the frame to the first support member, the second bimorph connecting the first support member to the second support member, and the third bimorph connecting the second support member to the platform.

12. The actuator system of claim 1, further comprising an auxiliary platform opened at the bottom thereof and an auxiliary actuator, the auxiliary platform being connected to the platform by the Z-axis actuator, and the auxiliary actuator connecting the object to the auxiliary platform in the Z-axis direction, for moving the object in the Z-axis direction by Z-axis direction transformation.

13. The actuator system of claim 1, wherein the X-axis actuator is fixed to the frame at one end and to the platform at an other end.

* * * * *